US009583559B2

(12) United States Patent
Lehnert et al.

(10) Patent No.: US 9,583,559 B2
(45) Date of Patent: Feb. 28, 2017

(54) CAPACITOR HAVING A TOP COMPRESSIVE POLYCRYSTALLINE PLATE

(71) Applicant: Infineon Technologies AG, Neubiberg (DE)

(72) Inventors: Wolfgang Lehnert, Lintach (DE); Stefan Pompl, Landshut (DE); Markus Meyer, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/665,521

(22) Filed: Mar. 23, 2015

(65) Prior Publication Data

US 2015/0194480 A1    Jul. 9, 2015

Related U.S. Application Data

(60) Division of application No. 13/660,966, filed on Oct. 25, 2012, now Pat. No. 9,012,295, which is a
(Continued)

(51) Int. Cl.
| | |
|---|---|
| H01L 21/02 | (2006.01) |
| H01L 21/28 | (2006.01) |
| H01L 21/763 | (2006.01) |
| H01L 21/8238 | (2006.01) |
| H01L 29/04 | (2006.01) |

(Continued)

(52) U.S. Cl.
CPC .......... *H01L 29/04* (2013.01); *H01L 21/0245* (2013.01); *H01L 21/0262* (2013.01); *H01L 21/02513* (2013.01); *H01L 21/02532* (2013.01); *H01L 21/28035* (2013.01); *H01L 28/60* (2013.01); *H01L 29/16* (2013.01); *H01L 29/945* (2013.01); *H01L 21/763* (2013.01);
(Continued)

(58) Field of Classification Search
CPC ................. H01L 28/60; H01L 29/51; H01L 28/40–28/92
See application file for complete search history.

(56) References Cited

U.S. PATENT DOCUMENTS

| | | |
|---|---|---|
| 4,971,926 A | 11/1990 | Kinugawa |
| 5,344,796 A | 9/1994 | Shin et al. |

(Continued)

FOREIGN PATENT DOCUMENTS

| | | |
|---|---|---|
| DE | 3530773 A1 | 3/1986 |
| DE | 3382688 T2 | 9/1993 |

(Continued)

OTHER PUBLICATIONS

Liu, G., et al., "Selective Area Crystallization of Amorphous Silicon Films by Low-Temperature Rapid Thermal Annealing," Aug. 14, 1989, pp. 660-662, Applied Physics Letters, 55 Issue 7, American Institute of Physics.

*Primary Examiner* — Kevin Parendo
(74) *Attorney, Agent, or Firm* — Slater Matsil, LLP

(57) ABSTRACT

In one embodiment a method of forming a compressive polycrystalline semiconductive material layer is disclosed. The method comprises forming a polycrystalline semiconductive seed layer over a substrate and forming a silicon layer by depositing silicon directly on the polycrystalline silicon seed layer under amorphous process conditions at a temperature below 600 C.

17 Claims, 5 Drawing Sheets

Related U.S. Application Data continuation of application No. 13/022,411, filed on Feb. 7, 2011, now Pat. No. 8,318,575.

(51) Int. Cl.
*H01L 29/16* (2006.01)
*H01L 29/51* (2006.01)
*H01L 29/78* (2006.01)
*H01L 29/94* (2006.01)
*H01L 49/02* (2006.01)

(52) U.S. Cl.
CPC ...... *H01L 21/823828* (2013.01); *H01L 29/51* (2013.01); *H01L 29/7833* (2013.01)

(56) References Cited

U.S. PATENT DOCUMENTS

| | | |
|---|---|---|
| 5,514,880 A | 5/1996 | Nishimura et al. |
| 5,561,310 A | 10/1996 | Woo et al. |
| 5,736,438 A | 4/1998 | Nishimura et al. |
| 5,804,499 A | 9/1998 | Dehm et al. |
| 5,902,650 A | 5/1999 | Feng et al. |
| 5,913,125 A | 6/1999 | Brouillette et al. |
| 5,930,625 A | 7/1999 | Lin et al. |
| 5,960,294 A | 9/1999 | Zahurak et al. |
| 6,197,669 B1 | 3/2001 | Twu et al. |
| 6,355,517 B1 | 3/2002 | Sunami et al. |
| 6,507,062 B1 * | 1/2003 | Joo ............... H01L 28/55 257/296 |
| 6,507,063 B2 | 1/2003 | Coolbaugh et al. |
| 6,610,361 B1 | 8/2003 | Heuer et al. |
| 6,872,620 B2 | 3/2005 | Chidambarrao et al. |
| 7,144,750 B2 | 12/2006 | Ouellet et al. |
| 7,157,327 B2 | 1/2007 | Haupt |
| 7,160,752 B2 | 1/2007 | Ouellet et al. |
| 7,189,618 B2 | 3/2007 | Lee |
| 8,143,135 B2 | 3/2012 | Kemerer et al. |
| 8,318,575 B2 | 11/2012 | Lehnert et al. |
| 2002/0001165 A1 | 1/2002 | Yamamichi |
| 2002/0019095 A1 | 2/2002 | Edgar |
| 2002/0135047 A1 | 9/2002 | Funk et al. |
| 2003/0045068 A1 | 3/2003 | Gutsche et al. |
| 2003/0132506 A1 | 7/2003 | Rhee et al. |
| 2003/0143801 A1 | 7/2003 | Basceri et al. |
| 2004/0079979 A1 | 4/2004 | Lee et al. |
| 2005/0067647 A1 | 3/2005 | Bulsara et al. |
| 2005/0106842 A1 | 5/2005 | Luoh |
| 2006/0094184 A1 | 5/2006 | Katsumata |
| 2006/0216420 A1 | 9/2006 | Shimada |
| 2006/0289931 A1 | 12/2006 | Kim et al. |
| 2007/0196946 A1 * | 8/2007 | Kasai ............... B81B 3/0072 438/50 |
| 2007/0267670 A1 | 11/2007 | Chittipeddi et al. |
| 2008/0067568 A1 | 3/2008 | Abbasi et al. |
| 2008/0076230 A1 | 3/2008 | Cheng et al. |
| 2008/0079048 A1 | 4/2008 | Kim et al. |
| 2008/0105935 A1 | 5/2008 | Ogura et al. |
| 2008/0246069 A1 | 10/2008 | Dyer et al. |
| 2009/0039404 A1 | 2/2009 | Cho et al. |
| 2009/0108403 A1 | 4/2009 | Gogoi |
| 2009/0130457 A1 | 5/2009 | Kim et al. |
| 2009/0191686 A1 | 7/2009 | Wang et al. |
| 2010/0087045 A1 * | 4/2010 | Shimomura ...... H01L 21/76254 438/458 |
| 2010/0164008 A1 * | 7/2010 | Mehrad ............ H01L 21/82384 257/369 |
| 2010/0252910 A1 | 10/2010 | Fujimori et al. |
| 2012/0007035 A1 | 1/2012 | Jo et al. |
| 2012/0061798 A1 | 3/2012 | Wong et al. |
| 2012/0181656 A1 | 7/2012 | Lehnert et al. |

FOREIGN PATENT DOCUMENTS

| | | |
|---|---|---|
| DE | 19918198 A1 | 12/1999 |
| DE | 102004060690 A1 | 3/2006 |
| DE | 60128028 T2 | 1/2008 |

* cited by examiner

CAPACITOR HAVING A TOP COMPRESSIVE POLYCRYSTALLINE PLATE

This application is a divisional application of Ser. No. 13/660,966 filed on Oct. 25, 2012, which is a continuation application of U.S. application Ser. No. 13/022,411, entitled "Compressive Polycrystalline Silicon Film and Method of Manufacture Thereof," which was filed on Feb. 7, 2011 and issued on Nov. 27, 2012 as U.S. Pat. No. 8,318,575, all of which are incorporated herein by reference.

CROSS-REFERENCE TO RELATED APPLICATIONS

This application relates to co-pending and commonly assigned U.S. patent application Ser. No. 13/007,392, which was filed on Jan. 14, 2010, and is entitled "Semiconductor Device and Method of Manufacture Thereof." The commonly assigned patent application is hereby incorporated herein by reference.

TECHNICAL FIELD

The present invention relates generally to semiconductor devices and method of making semiconductor devices.

BACKGROUND

Semiconductor devices are employed in various systems for a wide variety of application. Device fabrication typically involves a series of process steps including layering material on a semiconductor substrate wafer, patterning and etching one or more of the material layers, doping selected layers and cleaning the wafer.

Semiconductor manufacturers continually seek new ways to improve performance, decrease cost and increase capacity of semiconductor devices. Capacity and cost improvements may be achieved by shrinking device size. For example, in case of trench devices, e.g, such as capacitors and transistors, more and more cells can fit onto the chip without loosing device performance by enlarging the aspect ratio of the cells, e.g., reducing the diameter/and or enlarging the depth of the cells. With regard to trench capacitors the size reduction results in greater memory capacity for the chip or higher possible specific capacities (capacity per chip area). Cost reduction is achieved through economies of scale. Unfortunately, semiconductor manufacturing gets more and more difficult when device component size is reduced. Therefore, it is a challenge to balance cost reduction by size reduction (shrink) with other manufacturing constrains.

SUMMARY OF THE INVENTION

These and other problems are generally solved or circumvented, and technical advantages are generally achieved, by embodiments of the present invention.

In accordance with an embodiment a method of forming a compressive polycrystalline semiconductive material layer is disclosed. The method comprises forming a polycrystalline semiconductive seed layer over a substrate and forming a silicon layer by depositing silicon directly on the polycrystalline silicon seed layer under amorphous process conditions at a temperature below 600 C.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon material. The invention may also be applied, however, to other semiconductive materials.

In semiconductor manufacturing more and more vertical semiconductor devices may be placed on a wafer. Vertical semiconductor devices increase the surface area on a first side of the wafer versus a second, opposite, side of the wafer. Forming material layers on the increased surface area of the first side of the wafer may increase the thermal stress and/or the intrinsic stress on the wafer. The more stress is placed on one side of the wafer the more the wafer bows. The wafer bow is substantially larger for wafers with vertical semiconductor devices than for wafers with planar semiconductor devices using the same materials. Even thin material layers on the increased surface area of the one side of the wafer may increase the wafer bow substantially. Current manufacturing specifications require a wafer bow of less than about 100 μm. Processing a wafer without stress engineering can lead to wafer bows of 1000 μm or more.

Figure 1:
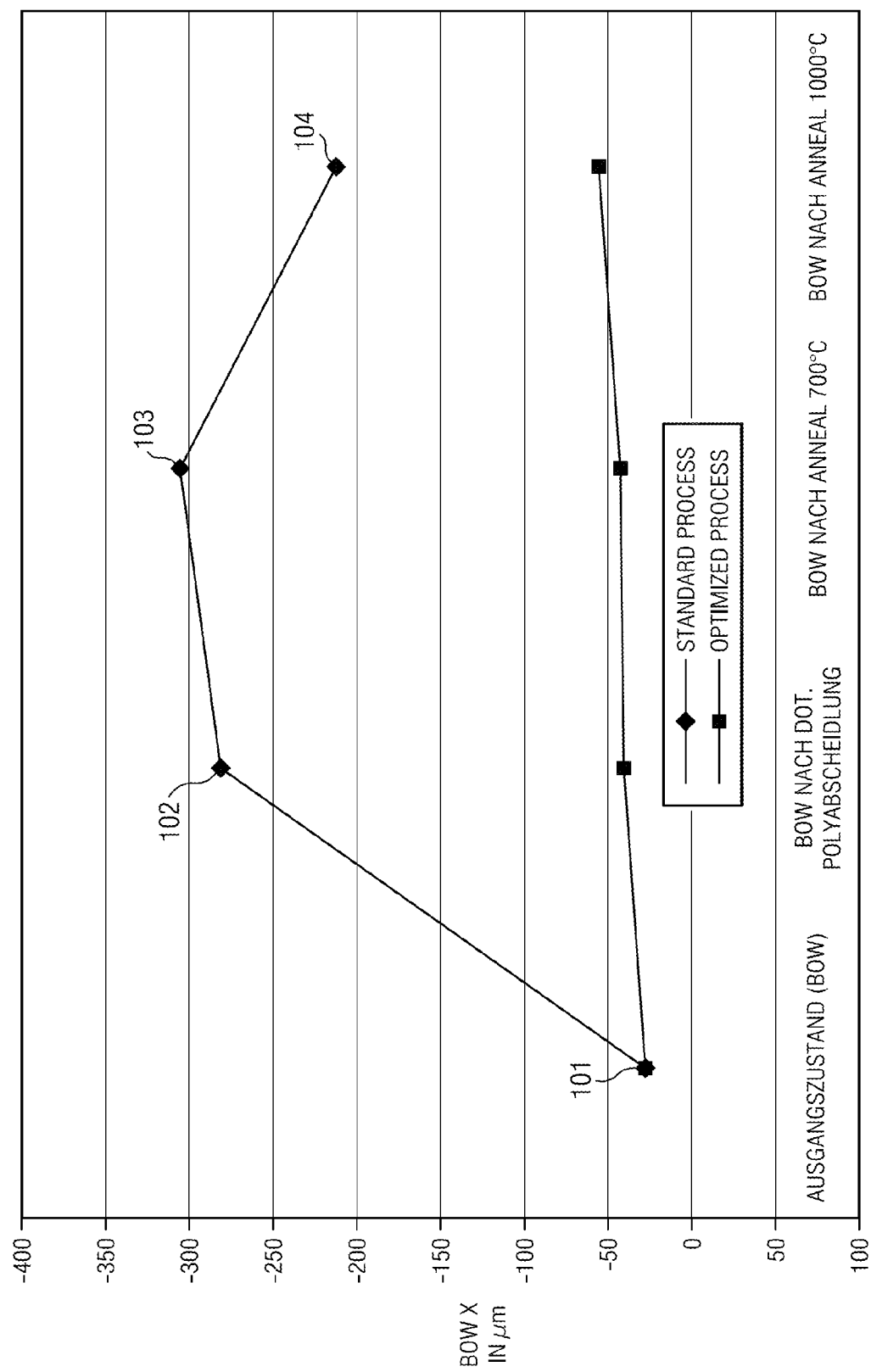
FIG. 1 shows a wafer bow for a standard process and for an optimized process.

FIG. 1 shows wafer bows for a standard polycrystalline silicon deposition process and an optimized process for different wafer processing stages. The bow of the wafer in a standard process is about 25 μm at stage 101. After the deposition of polycrystalline silicon the bow of the wafer is little less than about 300 μm (stage 102). Annealing the wafer to a temperature of about 700 C leads to a wafer bow more than about 300 μm (stage 103). Further annealing the wafer to a temperature of about 1000 C decreases the wafer bow 104 to more than above 200 μm (stage 104). Therefore, the standard polycrystalline silicon deposition process may lead to wafer bows far outside the required specification of less than about 100 μm.

Figure 2:
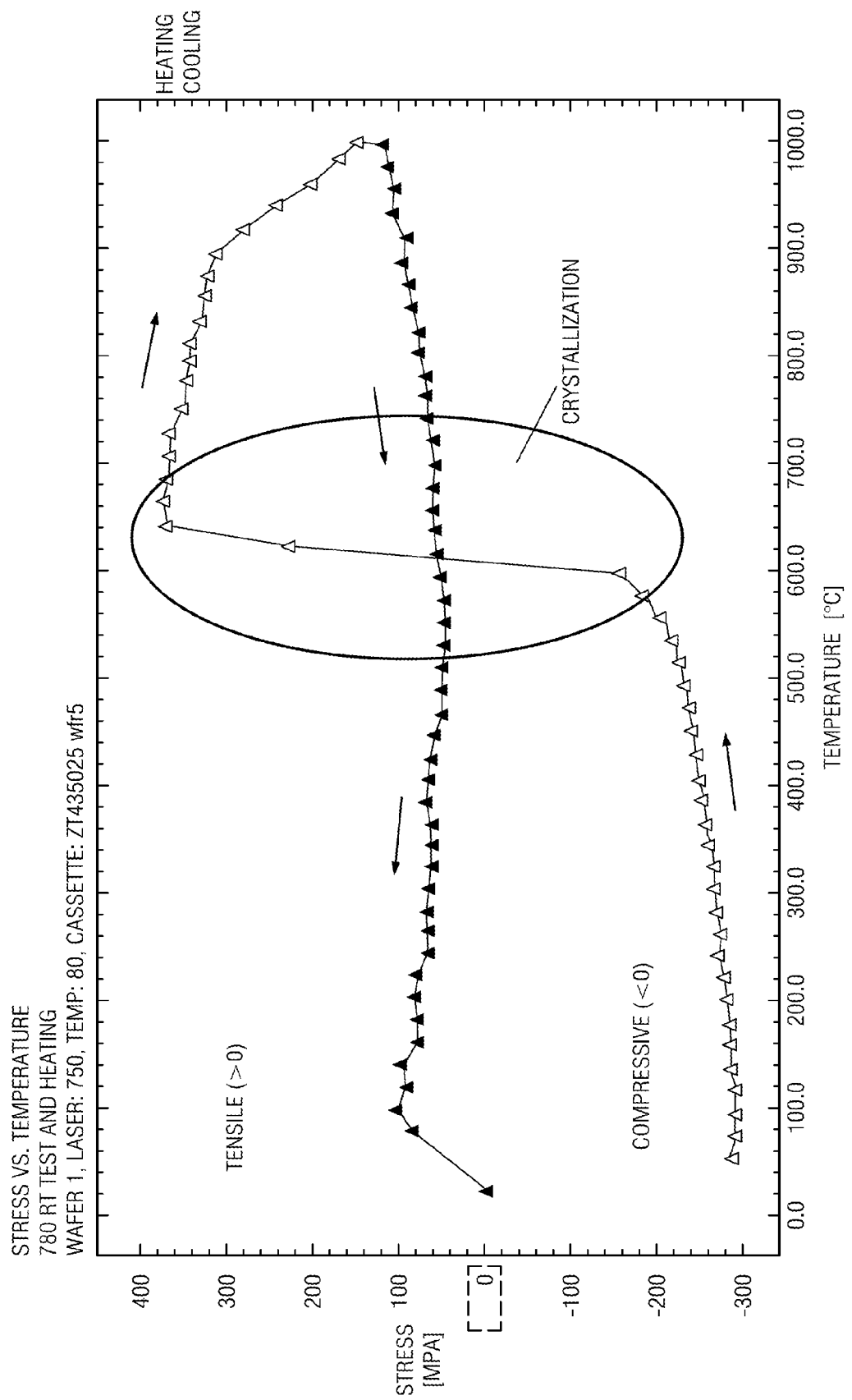
FIG. 2 shows a stress temperature picture for silicon.

FIG. 2 shows stress temperature plots of an amorphous deposited silicon layer. The temperature from 0 C to 1000 C is illustrated along the x-axis and compressive and tensile stress is illustrated along the y-axis. As can be seen from the stress temperature graph, amorphous silicon is compressive and becomes tensile when crystallized. In other words, amorphous silicon is compressive and becomes tensile when annealed over the crystallization temperature. In contrast, silicon deposited as a polycrystalline silicon film is always compressive.

The stress temperature graph further shows that stress decreases from lower temperatures (from about 100 C) to higher temperatures (up to about 600 C) for amorphous silicon and that stress also decreases from lower temperatures (from about 600 C) to higher temperatures (up to about 1000 C) for crystallized silicon. In other words, compressive stress of an amorphous silicon film decreases before the film crystallizes and tensile stress of a crystallized silicon film decreases when annealed to temperatures of about 1000 C.

Conductive in-situ doped polycrystalline silicon films are typically tensile because they are deposited under amorphous deposition conditions and then annealed over the crystallization temperature. Compressive in-situ doped conductive polycrystalline silicon films with similar characteristics (e.g., uniformity, roughness, sheet resistance) than tensile in-situ doped conductive polycrystalline silicon films are not known in the art.

Stress engineering may require balancing the stress on the wafer to keep the wafer bow within the specification limits. One possible solution is to provide only thin polycrystalline silicon films. However, thin polycrystalline silicon films may have substantially different electrical parameters such as a higher film resistance which may be undesirable in some applications. Another possible solution is to provide an additional compressive material film to the tensile polycrystalline film to compensate for the increased tensile stress. However, depositing additional material layers may add additional processing steps and may not always be desirable. Yet another possible solution is to anneal the tensile polycrystalline silicon to a temperature of over about 900 C or higher. However, annealing the tensile polycrystalline silicon may reduce the stress but cannot compensate or cancel out the stress. A final possible solution may be depositing a material layer on the second, opposite, side of the wafer to compensate for the tensile stress induced by the tensile polycrystalline silicon film. However, depositing an additional stress layer on the opposite side of the wafer may put the wafer under increased stress levels so that the wafer may break.

These and other problems are generally solved or circumvented, and technical advantages are generally achieved, by embodiments of the present invention. An embodiment provides a compressive polycrystalline semiconductive film having amorphous film characteristics and a method of making such a film under amorphous deposition conditions. In one embodiment a film stack comprising compressive and tensile polycrystalline semiconductive films is disclosed. In one embodiment a capacitor and a transistor is disclosed comprising the compressive polycrystalline semiconductive film having amorphous film properties. In one embodiment a wafer is disclosed employing compressive and tensile polycrystalline silicon films to achieve a wafer bow within the required specification, e.g., below about 100 μm.

Figure 3A:
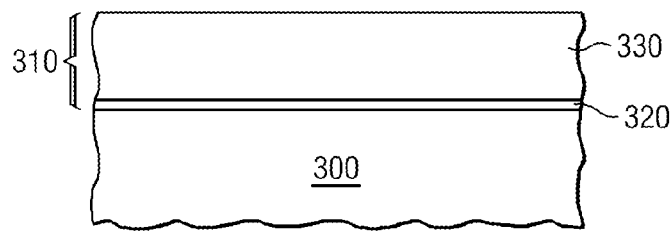
FIG. 3a shows a compressive polycrystalline semiconductive layer.

FIG. 3a shows a compressive polycrystalline silicon film 310 arranged on a substrate 300. The compressive polycrystalline silicon film 310 may be formed by forming a polycrystalline silicon seed layer 320 and depositing a silicon layer 330 under amorphous silicon deposition conditions directly on the polycrystalline silicon seed layer 320. The silicon layer 330, deposited under amorphous silicon process conditions, may form a polycrystalline silicon layer 330 on the top surface of the polycrystalline silicon seed layer 320. The polycrystalline silicon film 310 manufactured according such a process may be compressive. The polycrystalline silicon film 310 may change its stress level after annealing the silicon over the crystallization temperature but the stress may always remain compressive In one embodiment the polycrystalline silicon seed layer 320 is formed by depositing an amorphous silicon seed layer over the substrate 300. The amorphous silicon seed layer may be formed using a low pressure chemical vapor deposition process (LPCVD). Alternatively, the amorphous silicon seed layer may be formed using plasma enhanced chemical vapor deposition (PECVD). The amorphous silicon seed layer may be formed at a temperature between about 500 C to about 600 C and a pressure of about 300 mTorr to about 1000 mTorr. Alternatively the deposition temperature is between about 520 C and about 560 C. The amorphous silicon seed layer is annealed to a temperature of over about 600 C to crystallize the amorphous silicon seed layer. The amorphous silicon seed layer may be formed as doped or undoped amorphous silicon seed layer.

In one embodiment the polycrystalline silicon seed layer 320 is formed directly over the substrate 300. The crystalline silicon seed layer 320 may be formed using a low pressure chemical vapor deposition process (LPCVD) or a plasma enhanced chemical vapor deposition (PECVD). The polycrystalline silicon seed layer 320 is formed by depositing polycrystalline silicon at temperatures between about 600 C to about 640 C and a pressure of about 300 mTorr to about 1000 mTorr. The polycrystalline silicon seed layer 320 may be formed as doped or undoped polycrystalline silicon seed layer.

The polycrystalline silicon layer 330 may be deposited under amorphous deposition conditions below a temperature of about 600 C. For example, the polycrystalline silicon layer 330 may be deposited at a temperature between about 520 C to about 560 C and a pressure between about 300 mTorr and about 1000 mTorr using a low pressure chemical vapor deposition process (LPCVD) or plasma enhanced chemical vapor deposition (PECVD). Alternatively, the polycrystalline silicon layer 330 may be deposited at temperatures up to about 650 C with a rapid thermal chemical vapor deposition (RTCVD) process. The silicon layer 330 is formed as a polycrystalline silicon layer even though the silicon layer 330 is deposited under amorphous silicon deposition conditions.

The growth of the silicon layer 330 is polycrystalline because of its direct deposition on the polycrystalline silicon seed layer 320. The deposited silicon film starts growing on a clean silicon surface of the silicon seed layer 320 having the same structure as the subjacent seed layer 320. The layer properties of the polycrystalline silicon film 310 such as film homogeneity, film resistance and film roughness are similar and almost unchanged to that of an amorphous silicon film. The layer properties of the polycrystalline silicon film 310 may be different than film properties of a polycrystalline silicon film deposited under polycrystalline deposition conditions, e.g., a deposition process of silicon with temperatures above about 600 C or 650 C.

The silicon layer 330 may be deposited as doped or undoped silicon layer. The silicon film 310 may be annealed over a temperature of about 600 C. The silicon film 310 may be annealed to activate the dopants, for example. The silicon film 310 may be a compressive polycrystalline silicon film even though the film 310 is annealed over a temperature of about 600 C.

The deposition of the silicon layer 330 may start at an absolutely clean top surface of the polycrystalline silicon seed layer 320. The polycrystalline silicon seed layer 320 may not have any contamination on its top surface when the deposition of the silicon layer 330 begins. Fore example, there may be no oxide (native or not) or nitride on the top surface of the silicon seed layer 320.

The type and the amount of stress of the polycrystalline silicon film 310 may be selected or adjusted by the deposition conditions of the polycrystalline silicon film 310. The polycrystalline silicon film 310 can be made less compressive if the polycrystalline silicon seed layer 320 is relatively thick and the silicon layer 330 is relatively thin. The polycrystalline silicon film 310 can be made more compressive if the silicon seed layer 320 is relatively thin and the silicon layer 330 is relatively thick. The stress level of the polycrystalline silicon film 310 can be adjusted by adjusting the ratio of the seed layer 320 and the silicon layer 330.

The polycrystalline silicon film 310 may be formed in an in-situ deposition process. The in-situ deposition process may have the advantage of being more cost efficient than forming the polycrystalline silicon seed layer 320 and the silicon layer 330 in separate and individual process steps. However, forming the polycrystalline silicon film 310 in separate and individual process steps (not in-situ) may provide advantages for some embodiments.

Figure 3B:
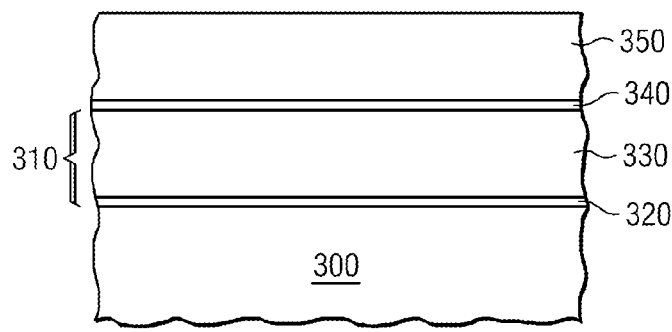
FIG. 3b shows a layer stack having a compressive polycrystalline semiconductive layer and a tensile polycrystalline semiconductive layer.

Referring now to FIG. 3b, the deposition of the silicon layer 330 and therefore the formation of the polycrystalline silicon film 310 may be stopped at any time. An interface may 340 be formed on the surface of the silicon film 310. For example, the interface layer 340 may be a thin oxide or nitride layer. The interface layer 340 may be about less than 2 nm or may be about 1 nm to about 2 nm thick. After forming the interface layer 340 a second silicon film 350 such as a polycrystalline silicon film may be deposited. The second polycrystalline silicon film 350 may be tensile.

The thin layer 340 may be a silicon oxide layer. In one embodiment the thin silicon dioxide layer is formed using silane and oxygen. The reaction may be $SiH_4+O_2 \rightarrow SiO_2+2H_2$. In another embodiment the thin silicon dioxide layer is formed using dichlorosilane ($SiCl_2H_2$) and nitrous oxide ($N_2O$). The reaction may be $SiCl_2H_2+2N_2O \rightarrow SiO_2+2N_2+2HCl$. The thin oxide layer 340 may also be formed by using precursors such as $H_2O$, $O_2$, $O_3$ or $N_2O$ at temperatures of above about 500 C. Alternatively, the thin oxide layer 340 may be formed as a native oxide by exposing the wafer to ambient air.

The thin layer 340 may be a silicon nitride layer. In one embodiment the thin silicon nitride layer is formed using silane and ammonia ($NH_3$) as process gases. The reaction may be $3\ SiH_4+4NH_3 \rightarrow Si_3N_4+12H_2$. Silicon nitride may also be deposited using dichlorosilane ($SiCl_2H_2$) and ammonia. The reaction may be $3\ SiCl_2H_2+4NH_3 \rightarrow Si_3N_4+6HCL+6H_2$. The nitride layer 340 may also be formed by nitridation with ammonia ($NH_3$) at temperatures of above about 600 C.

The oxide or nitride layer 340 may be formed in an in-situ process. For example, the interface may be formed by turning on the process gas such as $O_2$, $N_2O$ or ammonia ($NH_3$), leaving the workpiece in the process chamber. After forming the layer 340 with a desired thickness, the process gas may be turned off (including silane) and the process chamber may be purged using an inert gas. Alternatively, the interface may be formed in a separate and individual process (not in-situ).

After the process chamber is cleaned a second silicon film 350 may be formed. The second silicon film 350 may be formed as a tensile polycrystalline silicon film, for example. The tensile polycrystalline silicon film 350 may be formed by depositing amorphous silicon at temperatures below about 600 C and a pressure of about 300 mTorr to about 1000 mTorr. The second silicon film 350 may be formed by depositing silicon under amorphous deposition conditions and then annealing the deposited silicon over the crystallization temperature, e.g., about 600 C.

A multi-layer stack with a specific effective stress may be designed by forming alternating polycrystalline silicon films. One polycrystalline silicon film may be compressive and the next polycrystalline silicon film may be tensile. A multi-layer stack may be formed being substantially stress neutral. In one embodiment a plurality of compressive stress films or a plurality of tensile stress films may be deposited to form a multi-layer stack. The compressive and tensile films may be separated by thin nitride or oxide films.

Figure 4:
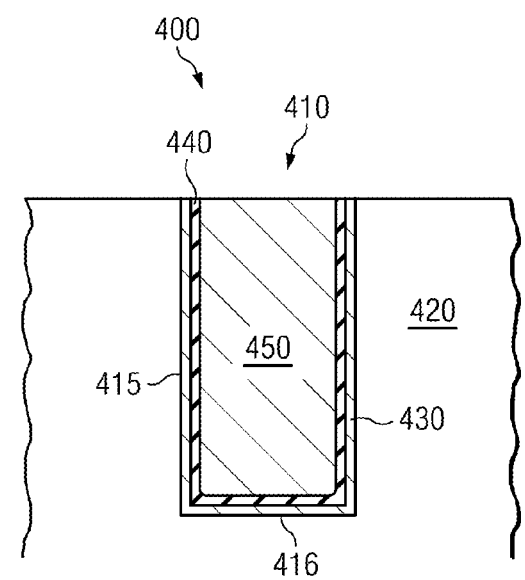
FIG. 4 shows a trench capacitor.

FIG. 4 shows a trench capacitor 400 having a compressive polycrystalline semiconductive material filling. The trench capacitor 400 comprises a trench 410 in a substrate 420 having sidewalls 415 and a bottom surface 416. The substrate 420 may be silicon (Si), silicon-germanium (SiGe), gallium arsenide (GaAs), indium phosphide (InP), silicon carbide (SiC), gallium nitride (GaN) or the like. The substrate 420 may be bulk silicon or silicon on insulator (SOI), for example.

A first electrode 430 is arranged in or on the trench sidewalls 415 and the bottom surface 416 as illustrated in FIG. 4. The first electrode 430 may be formed by implanting dopants into the bulk material or the sidewalls 415 and the bottom surface 416 of the trench 410. The first electrode 430 may be formed by gas phase doping, diffusion or by the use of doped bulk material. Alternatively, the first electrode 430 may be deposited along and over the sidewalls 415 and the bottom surface 416 of the trench 410 by depositing a conductive material such as a doped polysilicon. The first electrode 430 may be n doped or p doped. The first electrode 430 may be thin enough to fill the trench only partially. In one embodiment the first gate electrode may be compressive or tensile polycrystalline silicon.

A dielectric layer 440 is arranged along and over the first electrode 430. The dielectric layer 440 may comprise a single layer or a plurality of layers. The dielectric layer 440 may be a node dielectric. The node dielectric may be selected from a variety of dielectric materials. The dielectric material may be an oxide, a nitride, a high-k dielectric material or combinations thereof. The node dielectric may be a multilayer dielectric such as an oxide nitride oxide (ONO), an oxide nitride (ON), an oxide nitride oxide nitride (ONON), stacked high-k materials, high-k nano laminates or oxide/high-k/nitride stacks. The node dielectric may be $Al_2O_3$ or $Al_2O_3/TiO_2$. The dielectric layer 440 may comprise a thickness of about 2 nm to about 50 nm but in some embodiments the dielectric layer 440 may comprise a thickness of up to 100 nm.

A second gate electrode 450 may fill the entire trench 410 or may fill only a part of the trench 410. If the second electrode 450 fills only a part of the trench 410 the rest of the trench 410 may be filled with a fill material different than that of the second electrode 450. The material of the second gate electrode 450 may be a semiconductive material such as a silicon or germanium. In one embodiment the second gate electrode 450 is a compressive polycrystalline silicon according to embodiments previously described.

The second gate electrode 450 may be a multi layer stack comprising compressive and tensile polycrystalline semiconductive materials. For example, the second gate electrode 450 may comprise a first compressive polycrystalline semiconductive material up to a first thickness and a second tensile polycrystalline semiconductive material up to a second thickness. The trench may be filled with a plurality of alternating layers of tensile and compressive polycrystalline semiconductive materials. A layer of thin oxide or nitride may be formed between the compressive and the tensile semiconductive material layers. The compressive polycrystalline semiconductive material may be formed by one of the embodiments described previously. The polycrystalline semiconductive material may be a polycrystalline silicon material.

Figure 5:
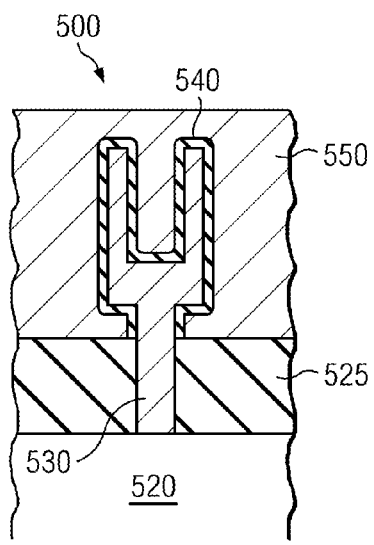
FIG. 5 shows a stacked capacitor.

FIG. 5 shows a stack capacitor 500. The stack capacitor 500 may be arranged over a substrate 520. A first electrode 530 may be arranged over a source region or a drain region in the substrate 520, for example. A lower part of the first electrode 530 may be embedded in an insulating layer 525 such as an oxide. An upper part of the first electrode 530 may be embedded in a second electrode 550. A dielectric layer 540 may be arranged between the first electrode 530 and the second electrode 550. The substrate 520, the first gate electrode 530, the capacitor dielectric 540 and the second gate electrode 550 may comprise the same materials as described above for the vertical trench capacitor 400. In particular, the first gate electrode 530 and/or the second gate electrode 550 may comprise a compressive polycrystalline semiconductive material or a combination of compressive and tensile polycrystalline semiconductive materials. The compressive polycrystalline semiconductive material may be formed by one of the embodiments described previously. The polycrystalline semiconductive material may be a polycrystalline silicon material.

Figure 6:
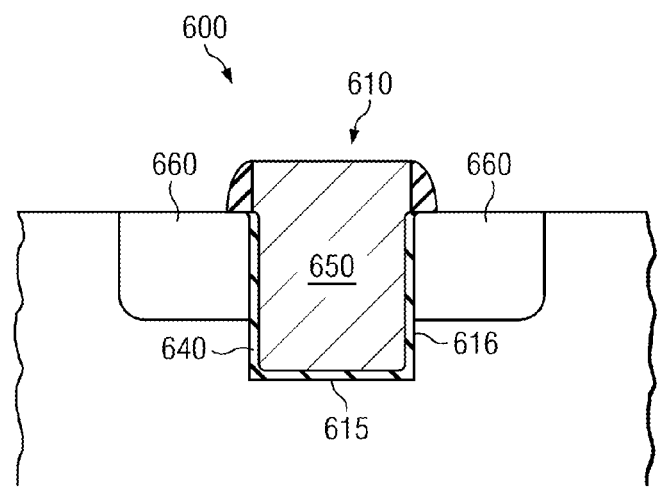
FIG. 6 shows a vertical transistor.

FIG. 6 shows a vertical transistor 600. The vertical transistor 600 comprises a trench 610 in a substrate 620 having sidewalls 615 and a bottom surface 616. The substrate 620 may be silicon (Si), silicon-germanium (SiGe), gallium arsenide (GaAs), indium phosphide (InP), silicon carbide (SiC), gallium nitride (GaN) or the like. The substrate may be bulk silicon or silicon on insulator (SOI), for example.

A gate dielectric layer 640 is arranged along and over the sidewalls 615 and the bottom surface 616 of the trench 610. The dielectric layer 640 may comprise a single layer or a plurality of layers. The dielectric layer 440 may be a gate dielectric. The gate dielectric may be selected from a variety of dielectric materials. The dielectric material may be an oxide, a nitride, a high-k dielectric material or combinations thereof. The gate dielectric may be a multilayer dielectric such as an oxide nitride oxide (ONO), an oxide nitride (ON), an oxide nitride oxide nitride (ONON), stacked high-k materials, high-k nano laminates or oxide/high-k/nitride stacks. The node dielectric may be $Al_2O_3$ or $Al_2O_3/TiO_2$. The dielectric layer 440 may comprise a thickness of about 2 nm to about 50 nm but in some embodiments the dielectric layer 440 may comprise a thickness of up to 100 nm.

A gate electrode 650 may be formed in the trench 610. The gate electrode 650 may comprise a compressive polycrystalline semiconductive material or a combination of compressive and tensile polycrystalline semiconductive materials. The compressive polycrystalline semiconductive material may be formed by one of the embodiments described previously. The polycrystalline semiconductive material may be a polycrystalline silicon material. Source and drain regions 660 may be formed next to the gate electrode 650. The source and drain regions 660 may be formed by doping the substrate 620 with n-type dopants or p-type dopants.

Figure 7:
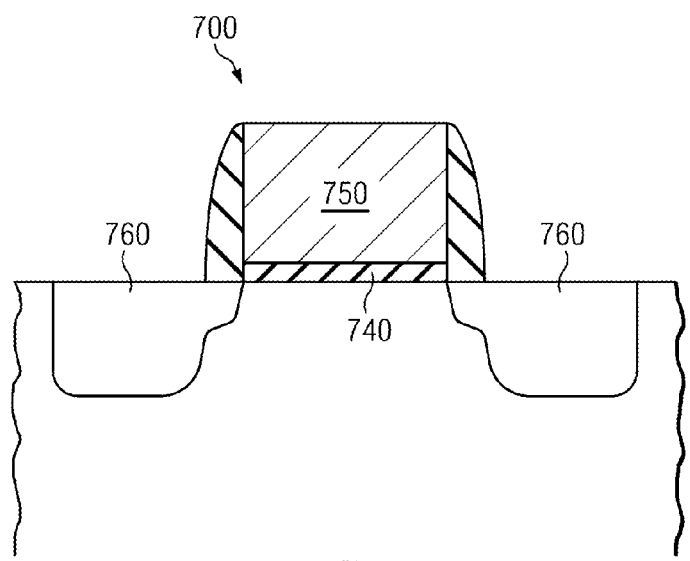
FIG. 7 shows a planar transistor.

FIG. 7 illustrates a planar transistor 700. The planar transistor 700 comprises a gate dielectric 740 arranged over a substrate 720 and a gate electrode 750 are arranged over the gate dielectric 740. Source and drain regions 760 are formed in the substrate 720 next to the gate dielectric 740 and the gate electrode 750. The substrate 720, the gate dielectric 740, the gate electrode 750 and the source and drain regions 760 may comprise the same materials as described for the vertical transistor 600.

Embodiments may include a vertical CMOS device comprising a vertical pMOS transistor and a vertical nMOS transistor both having a gate comprising a compressive polycrystalline semiconductive material or a combination of compressive and tensile polycrystalline semiconductive materials. Further embodiments may include a planar CMOS device comprising a planar pMOS transistor and a planar nMOS transistor both having gates comprising a compressive polycrystalline semiconductive material or a combination of compressive and tensile polycrystalline semiconductive materials.

Figure 8A:
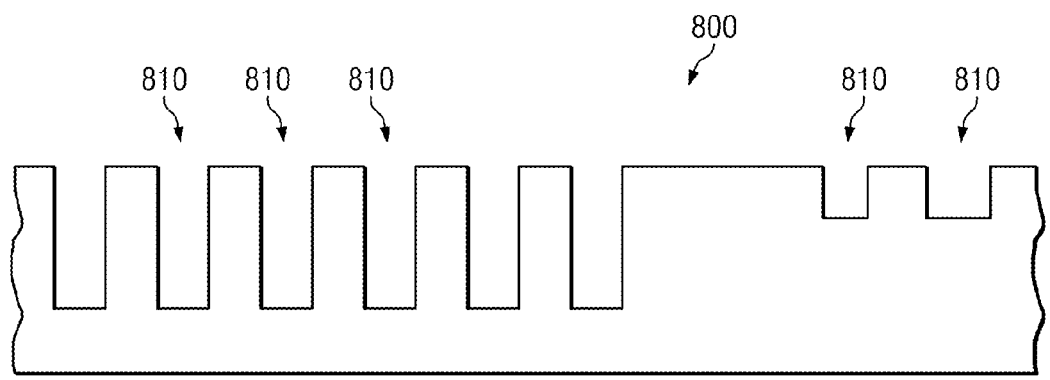
FIG. 8a-8c shows processing steps of a semiconductor device manufacturing on a wafer.
Figure 8B:
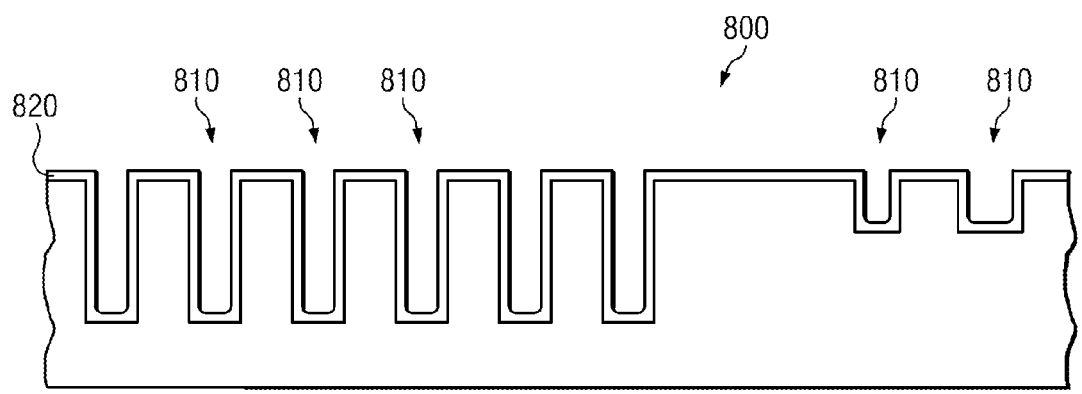
Figure 8C:
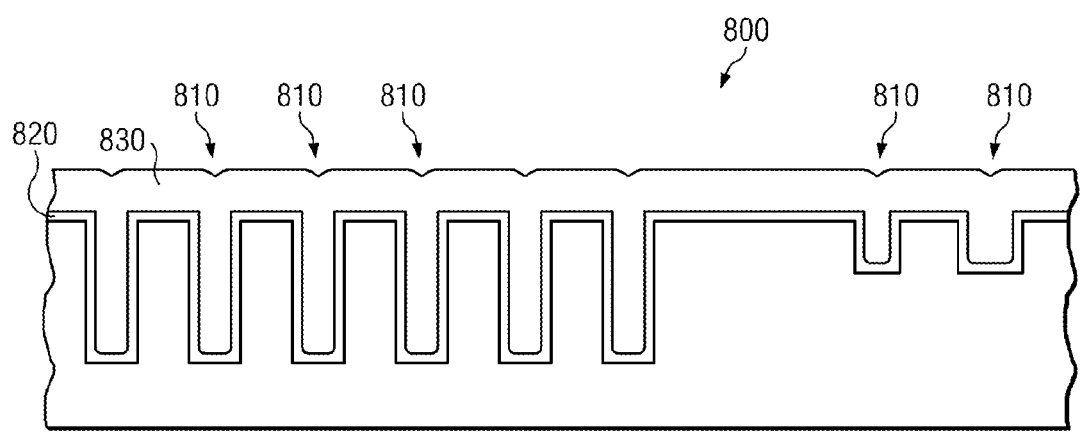

FIG. 8a illustrates a wafer 800. The wafer 800 may be a preprocessed wafer. The wafer 800 comprises a plurality of trenches 810. Referring now to FIG. 8b, a polycrystalline semiconductive seed layer 820 is formed over the wafer 800 in a first process step. The polycrystalline semiconductive seed layer 820 may be formed according to embodiments previously described. Referring now to FIG. 8c, the trenches 810 are filled with a semiconductive material 830 deposited under amorphous deposition conditions previously described. The wafer may be annealed over a temperature above 800 C. The trenches 810 may be filled with a compressive polycrystalline semiconductive material or a combination of tensile and compressive polycrystalline semiconductive materials. The excessive polycrystalline semiconductive material may be removed applying a chemical mechanical polishing (CMP), for example. Additional process steps may follow to form complete semiconductive devices. The polycrystalline semiconductive filled trenches may form planar or vertical semiconductive devices such as capacitors, transistors and CMOS devices. Embodiments using the compressive or the compressive/tensile polycrystalline semiconductive trench fillings may achieve wafer bows of less than about 100 µm or less than about 60 µm, as is illustrated, for example, at stage 110 of FIG. 1.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor comprising:
   a first plate;
   a dielectric; and
   a second plate separated from the first plate by the dielectric, wherein the second plate comprises a compressive polysilicon layer, wherein the second plate comprises a tensile polysilicon layer, wherein the tensile polysilicon layer is separated from the compressive polysilicon layer by an interface layer, and wherein the interface layer comprises an oxide or a nitride, wherein the dielectric and the first plate are embedded within the second plate.

2. The capacitor according to claim 1, wherein the compressive polysilicon layer comprises a doped compressive polysilicon layer.

3. The capacitor according to claim 1, wherein the tensile stress from the tensile polysilicon layer compensates the compressive stress from the compressive polysilicon layer.

4. The capacitor according to claim 1, wherein the capacitor is part of a vertical CMOS device comprising a vertical nMOS device and a vertical pMOS device.

5. The capacitor according to claim 1, wherein the capacitor is part of a planar transistor device.

6. The capacitor according to claim 1, wherein the capacitor is part of a trench capacitor.

7. The capacitor according to claim 1, wherein the capacitor is part of a stacked capacitor.

8. The capacitor according to claim 1, wherein the first plate comprises a first arm extending upwards in a first vertical direction, a second arm extending upwards in the first vertical direction, and a horizontal section connecting the first arm and the second arm, and wherein a region between the first arm and the second arm is filled with a material of the second plate.

9. A capacitor comprising:
a first plate comprises a tensile polysilicon layer;
a dielectric; and
a second plate separated from the first plate by the dielectric, wherein the second plate comprises a compressive polysilicon layer and a tensile polysilicon layer separated from the compressive polysilicon layer by an oxide or nitride layer, wherein the tensile stress from the tensile polysilicon layer compensates the compressive stress from the compressive polysilicon layer, wherein the first plate comprises a first arm extending upwards in a first vertical direction, a second arm extending upwards in the first vertical direction, and a horizontal section connecting the first arm and the second arm, wherein a region between the first arm and the second arm is filled with a material of the second plate.

10. The capacitor of claim 9, wherein the first plate further comprises a compressive polysilicon layer to compensate the tensile stress from the tensile polysilicon layer of the first plate.

11. A capacitor comprising:
a first plate;
a dielectric; and
a second plate separated from the first plate by the dielectric, wherein the second plate comprises a compressive polycrystalline semiconductive layer and a tensile polycrystalline semiconductive layer separated from the compressive polycrystalline semiconductive layer by an interface layer, and wherein the interface layer comprises an oxide or a nitride, wherein the dielectric and the first plate are embedded within the second plate.

12. The capacitor according to claim 11, wherein the compressive polycrystalline semiconductive layer comprises a doped compressive polysilicon layer.

13. The capacitor according to claim 11, wherein the tensile stress from the tensile polycrystalline semiconductive layer compensates the compressive stress from the compressive polycrystalline semiconductive layer.

14. The capacitor according to claim 11, wherein the capacitor is part of a vertical CMOS device comprising a vertical nMOS device and a vertical pMOS device.

15. The capacitor according to claim 11, wherein the capacitor is part of a planar transistor device.

16. The capacitor according to claim 11, wherein the capacitor is part of a trench capacitor.

17. The capacitor according to claim 11, wherein the capacitor is part of a stacked capacitor.

* * * * *